（12） United States Patent
Murakami (10) Patent No.: US 10,963,089 B2
(45) Date of Patent: Mar. 30, 2021

(54) TACTILE SENSATION PROVIDING APPARATUS AND TACTILE SENSATION PROVIDING METHOD (71) Applicant: KYOCERA Corporation, Kyoto (JP)

(72) Inventor: Kazuhiro Murakami, Machida (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/778,883

(22) PCT Filed: Nov. 10, 2016

(86) PCT No.: PCT/JP2016/083404
§ 371 (c)(1),
(2) Date: May 24, 2018

(87) PCT Pub. No.: WO2017/090449
PCT Pub. Date: Jun. 1, 2017

(65) Prior Publication Data
US 2018/0356891 A1    Dec. 13, 2018

(30) Foreign Application Priority Data
Nov. 27, 2015  (JP) .............................. JP2015-232210

(51) Int. Cl.
G06F 3/041  (2006.01)
G06F 3/01   (2006.01)
H03K 17/945 (2006.01)

(52) U.S. Cl.
CPC ............ *G06F 3/0416* (2013.01); *G06F 3/016* (2013.01); *G06F 3/041* (2013.01); *H03K 17/945* (2013.01)

(58) Field of Classification Search
CPC ........ G06F 3/016; G06F 3/0416; G06F 3/044; G06F 3/0414; G06F 2203/014; G06F 2203/04809; G06F 2203/04105; G06F 3/04886; G06F 3/0412; G06F 2203/04106; G06F 3/0304; G06F 3/045; G06F 2203/04108
See application file for complete search history.

(56) References Cited

U.S. PATENT DOCUMENTS

| 7,890,863 | B2* | 2/2011 | Grant | G06F 1/3231 |
| | | | | 715/702 |
| 8,405,618 | B2* | 3/2013 | Colgate | G06F 3/016 |
| | | | | 345/173 |
| 8,531,319 | B2* | 9/2013 | Ku | G06F 3/04886 |
| | | | | 341/20 |
| 8,736,575 | B2* | 5/2014 | Kasahara | G06F 3/0416 |
| | | | | 345/174 |

(Continued)

FOREIGN PATENT DOCUMENTS

| EP | 2138928 A2 | 12/2009 |
| JP | 2010-506302 A | 2/2010 |
| JP | 2014-046867 A | 3/2014 |

*Primary Examiner* — Michael J Jansen, II
(74) *Attorney, Agent, or Firm* — Studebaker & Brackett PC (57) ABSTRACT A tactile sensation providing apparatus includes a touch sensor, a tactile sensation provider that provides a tactile sensation on a touch surface of the touch sensor, a proximity sensor that detects the approach of an object to the touch sensor, and a controller that starts driving of the tactile sensation provider in accordance with detection by the proximity sensor.

14 Claims, 6 Drawing Sheets

(56) References Cited

U.S. PATENT DOCUMENTS

| | | | |
|---|---|---|---|
| 8,780,053 B2* | 7/2014 | Colgate | G06F 3/016 345/173 |
| 8,836,664 B2* | 9/2014 | Colgate | G06F 3/045 345/173 |
| 8,886,263 B2* | 11/2014 | Hosoi | G06F 1/163 455/575.2 |
| 8,898,564 B2* | 11/2014 | Grant | G06F 3/0416 715/702 |
| 8,952,931 B2* | 2/2015 | Kasahara | G06F 3/0416 345/174 |
| 9,046,925 B2* | 6/2015 | Schuckle | G06F 3/016 |
| 9,256,312 B2* | 2/2016 | Takenaka | G06F 3/0414 |
| 9,417,695 B2* | 8/2016 | Griffin | G06F 3/016 |
| 9,600,075 B2* | 3/2017 | Grant | G06F 3/016 |
| 9,671,897 B2* | 6/2017 | Kasahara | G06F 3/0416 |
| 9,742,887 B2* | 8/2017 | Hosoi | H04M 1/05 |
| 9,916,046 B2* | 3/2018 | Kasahara | G06F 3/044 |
| 10,073,527 B2* | 9/2018 | Cruz-Hernandez | G06F 3/016 |
| 10,133,393 B2* | 11/2018 | Yu | G06F 3/0416 |
| 10,296,134 B2* | 5/2019 | Kasahara | G06F 3/0416 |
| 10,712,854 B2* | 7/2020 | Akabane | G06F 3/044 |
| 10,719,146 B2* | 7/2020 | Tanaka | G06F 3/016 |
| 2007/0236450 A1* | 10/2007 | Colgate | G06F 3/0414 345/156 |
| 2009/0106655 A1* | 4/2009 | Grant | G06F 3/04886 715/702 |
| 2009/0284485 A1* | 11/2009 | Colgate | G06F 3/016 345/173 |
| 2011/0138277 A1* | 6/2011 | Grant | G06F 3/03545 715/702 |
| 2011/0248916 A1* | 10/2011 | Griffin | G06F 3/016 345/157 |
| 2012/0056849 A1* | 3/2012 | Kasahara | G06F 3/044 345/174 |
| 2012/0056850 A1* | 3/2012 | Kasahara | G06F 3/0416 345/174 |
| 2012/0249474 A1* | 10/2012 | Pratt | G06F 1/1694 345/174 |
| 2012/0289162 A1* | 11/2012 | Hosoi | H04M 1/0258 455/41.3 |
| 2013/0154988 A1 | 6/2013 | Inoue et al. | |
| 2013/0222303 A1* | 8/2013 | Colgate | G06F 3/0421 345/173 |
| 2014/0043276 A1* | 2/2014 | Takenaka | A63F 13/218 345/173 |
| 2014/0062872 A1 | 3/2014 | Tanaka | |
| 2014/0071117 A1* | 3/2014 | Schuckle | G06F 3/0416 345/419 |
| 2014/0232687 A1* | 8/2014 | Kasahara | G06F 3/04883 345/174 |
| 2015/0054768 A1* | 2/2015 | Grant | G06F 3/03545 345/173 |
| 2015/0123927 A1* | 5/2015 | Kasahara | G06F 3/044 345/173 |
| 2016/0110013 A1* | 4/2016 | Yu | G06F 3/0416 345/173 |
| 2016/0248894 A1* | 8/2016 | Hosoi | H04W 52/027 |
| 2016/0342208 A1* | 11/2016 | Levesque | G06F 3/016 |
| 2016/0349912 A1* | 12/2016 | Faubert | G06F 3/016 |
| 2017/0235417 A1* | 8/2017 | Kasahara | G06F 3/04845 345/174 |
| 2017/0322631 A1* | 11/2017 | Cruz-Hernandez | G06F 3/016 |
| 2018/0356891 A1* | 12/2018 | Murakami | G06F 3/041 |
| 2019/0138140 A1* | 5/2019 | Akabane | G06F 3/04847 |

* cited by examiner

TACTILE SENSATION PROVIDING APPARATUS AND TACTILE SENSATION PROVIDING METHOD

CROSS-REFERENCE TO RELATED APPLICATION

The present application claims priority to and the benefit of Japanese Patent Application No. 2015-232210 filed Nov. 27, 2015, the entire contents of which are incorporated herein by reference.

TECHNICAL FIELD

The present disclosure relates to a tactile sensation providing apparatus and a tactile sensation providing method.

BACKGROUND

Devices that provide a tactile sensation when an object, such as a finger or a stylus, touches a touch sensor are known. Devices that accept input by an object approaching a touch sensor to within a certain distance without the object touching the touch sensor are also known, as in patent literature (PTL) 1, for example.

CITATION LIST

Patent Literature

PTL 1: JP2014-46867A

SUMMARY

A tactile sensation providing apparatus according to an embodiment of the present disclosure includes a touch sensor and a tactile sensation provider configured to provide a tactile sensation on a touch surface of the touch sensor. The tactile sensation providing apparatus includes a proximity sensor configured to detect an approach of an object to the touch sensor and a controller configured to start driving of the tactile sensation provider in accordance with detection by the proximity sensor.

A tactile sensation providing method according to an embodiment of the present disclosure includes detecting, using a proximity sensor, an approach of an object to a touch sensor. The tactile sensation providing method includes starting driving of a tactile sensation provider in accordance with detection by the proximity sensor to provide a tactile sensation on a touch surface of the touch sensor.

DETAILED DESCRIPTION

A tactile sensation providing apparatus according to the present disclosure may be an in-vehicle device, such as a car navigation system. The tactile sensation providing apparatus may also be a mobile phone, a smartphone, a tablet personal computer (PC), a notebook PC, or the like provided with a touch panel. The tactile sensation providing apparatus is not limited to such portable devices. The tactile sensation providing apparatus may be any of a variety of electronic devices, such as a desktop PC, a household appliance, an industrial device or factory automation (FA) device, a dedicated terminal, or the like provided with a touch panel.

First Embodiment

[Configuration of Tactile Sensation Providing Apparatus]

Figure 1:
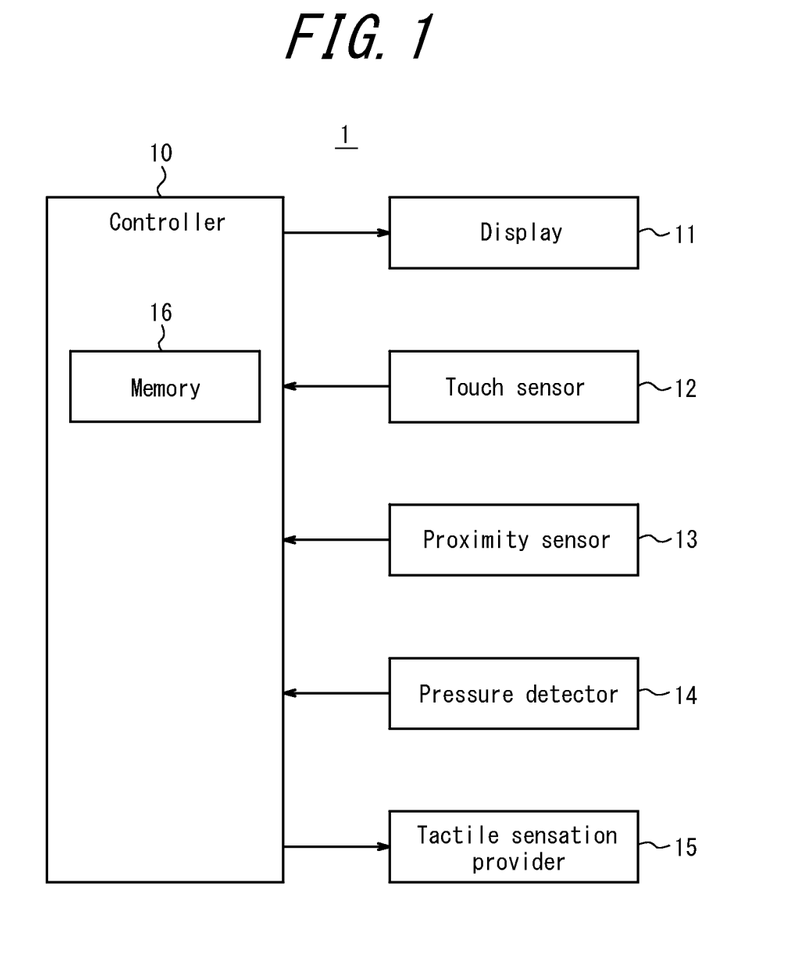
FIG. 1 is a functional block diagram illustrating an example of the schematic configuration of a tactile sensation providing apparatus according to a first embodiment.

As illustrated in FIG. 1, a tactile sensation providing apparatus 1 includes a controller 10, a display 11, a touch sensor 12, a proximity sensor 13, a pressure detector 14, and a tactile sensation provider 15.

The controller 10 connects to the display 11, the touch sensor 12, the proximity sensor 13, the pressure detector 14, and the tactile sensation provider 15. The controller 10 transmits signals or information associated with a signal to each of the connected components. The information associated with a signal is also referred to as control information. The controller 10 acquires control information from each connected component. In FIG. 1, the arrows connecting the controller 10 with other components indicate the main direction in which control information is output. For example, the arrow between the controller 10 and the display 11 indicates that control information is mainly output from the controller 10 to the display 11. The signals or control information may be output in the opposite direction from the direction of the arrow.

The controller 10 includes a memory 16. The memory 16 may, for example, be a semiconductor memory. Various information, programs for causing the tactile sensation providing apparatus 1 to operate, and the like may be stored in the memory 16. The memory 16 may function as a working memory.

The controller 10 may store the control information in the memory 16. The controller 10 may acquire the control information from the memory 16. The controller 10 controls the connected components in accordance with the control information. Control operations executed by the controller 10 are described below.

The display 11 displays characters, images, operation objects, pointers, and the like on the basis of the control information acquired from the controller 10. For example, in the case of a mobile electronic device, the display 11 may display operation objects such as a phone, mail, browser, or camera on a home screen. In the case of an in-vehicle electronic device, the display 11 may display operation objects such as a car navigation system, audio, or air conditioner on a home screen.

The display 11 may, for example, be a display device such as a liquid crystal display, an organic EL display, or an inorganic EL display. The display 11 is not limited to these examples.

It is not essential for the tactile sensation providing apparatus 1 to display images or the like. When images or the like are not displayed on the tactile sensation providing apparatus 1, the tactile sensation providing apparatus 1 need not include the display 11. In this case, the display 11 may be separate from the tactile sensation providing apparatus 1. The operation buttons and the like of operation objects displayed on the display 11 may be operated by the cursor, pointer, or the like displayed on the display 11 being moved by operation of the below-described touch sensor 12.

The touch sensor 12 detects a touch by an object, such as a finger or stylus, on a touch surface of the touch sensor 12. It is assumed below that the touch on the touch surface is by a finger. The touch on the touch surface may be by another object, such as a stylus.

When detecting the touch of a finger on the touch surface, the touch sensor 12 acquires the coordinates of the touched position and outputs the coordinates as control information to the controller 10. The user causes the controller 10 to execute predetermined processing by touching a finger to the touch surface of the touch sensor 12 in correspondence with the display position of an operation object displayed on the display 11.

The touch sensor 12 may detect a touch by any system, such as a capacitive system, a resistive film system, a surface acoustic wave system or ultrasonic wave system, an infrared system, an electromagnetic induction system, a load detection system, or the like. The touch sensor 12 may, for example, be configured by a transparent member so as not to block the display of the display 11.

The proximity sensor 13 detects whether a finger has approached to within a predetermined distance from the touch surface of the touch sensor 12. When detecting the approach of a finger to the touch surface, the proximity sensor 13 acquires the coordinates of the position approached by the finger and outputs the coordinates as control information to the controller 10.

The proximity sensor 13 may, for example, be a light-blocking sensor. A light-blocking sensor may be constituted by a projector and an optical detector. The projector and the optical detector are arranged at the edges of the touch sensor 12. The positions of the projector and the optical detector are adjusted so that light emitted from the projector enters the optical detector. The positions of the projector and the optical detector are adjusted so that the path of light from the projector to the optical detector is included in a plane that is substantially parallel to the touch surface of the touch sensor 12 and is at a predetermined distance from the touch surface. The path of light from the projector to the optical detector is also referred to as the optical path.

By the projector and the optical detector being provided in this way, the proximity sensor 13 can detect that an object, such as a finger or stylus, has approached to within a predetermined distance from the touch surface. Since an object approaching to within a predetermined distance from the touch surface blocks the optical path, light no longer enters the optical detector. As a result, the proximity sensor 13 can detect that an object has approached to within a predetermined distance from the touch surface when light does not enter the optical detector.

When the proximity sensor 13 is a light-blocking sensor, a plurality of sets of a projector and an optical detector can be arrayed to detect the coordinates of the approach position of a finger with respect to the touch surface of the touch sensor 12. If xy-coordinates on the touch surface are used, a plurality of sets of a projector and an optical detector to detect the x-coordinate of the approach position of the finger are arranged in a line in the x-axis direction. The x-coordinate of the approach position of the finger can be identified by identifying the optical detector in which light does not enter. The y-coordinate of the approach position of the finger can be identified in the same way as the x-coordinate.

The projector of the proximity sensor 13 includes a light-emitting element. Non-limiting examples of the light-emitting element include an infrared or visible light LED or laser. The optical detector of the proximity sensor 13 includes a light-detecting element. A non-limiting example of the light-detecting element is a photodiode.

When the touch sensor 12 is a capacitive sensor, the touch sensor 12 may be configured to function also as the proximity sensor 13. This configuration can achieve increased sensitivity of the capacitive sensor. The touch sensor 12 may detect whether a finger has approached to within a predetermined distance from the touch surface by appropriately setting a threshold for the change in capacitance detected when a finger approaches the touch sensor 12. The touch sensor 12 may identify the coordinates of the approach position of the finger.

The pressure detector 14 detects pressure caused by the user's finger, a stylus, or the like that touches the touch surface of the touch sensor 12 and then pushes down on the touch sensor 12. The pressure detector 14 then outputs data based on the pressure to the controller 10 as control information.

The pressure detector 14 is, for example, configured using a strain gauge sensor, a piezoelectric element, or the like that experiences a change in physical or electrical characteristics in response to pressure. The physical characteristics may include strain and the like. The electrical characteristics may include resistance, voltage, and the like. When the pressure detector 14 is, for example, configured using a piezoelectric element, the piezoelectric element of the pressure detector 14 outputs a voltage value corresponding to the magnitude of the load due to pressure on the touch sensor 12. The voltage value corresponding to the magnitude of the load due to pressure is also referred to as data based on pressure. The data based on pressure is not limited to a voltage value and may be the magnitude of the load due to pressure, a resistance value, or the like.

The pressure detector 14 may be configured in accordance with the detection system of the touch sensor 12. For example, when the detection system of the touch sensor 12 is a resistive film system, the magnitude of resistance corresponding to the size of the contact area may be associated with the pressure load on the touch surface of the touch sensor 12. When the touch sensor 12 uses a capacitive system, the magnitude of capacitance may be associated with the pressure load on the touch sensor 12. With this approach, the pressure detector 14 may be configured without using a strain gauge sensor, a piezoelectric element, or the like.

The controller 10 may accept input corresponding to the operation object at the touched position when the magnitude of pressure acquired from the pressure detector 14 is a predetermined pressure or greater. This configuration can reduce the occurrence of erroneous input due to the user mistakenly touching the touch surface.

The tactile sensation provider 15 provides a tactile sensation by generating vibration with various patterns in accordance with a drive signal acquired from the controller 10. The controller 10 starts to drive the tactile sensation provider 15 by outputting a drive signal as control information to the tactile sensation provider 15.

The tactile sensation provider 15 may be configured using a piezoelectric element, an ultrasonic transducer, a vibration motor or eccentric motor, or the like. The tactile sensation provider 15 generates vibration with a vibration pattern corresponding to a click feeling, a material feeling, or the like, for example, to provide a tactile sensation, such as the click feeling, material feeling, or the like, to the user touching the touch sensor 12.

The tactile sensation provider 15 may be configured integrally with the pressure detector 14. When the pressure detector 14 and tactile sensation provider 15 are both configured using a piezoelectric element, they may share a common piezoelectric element. This is because a piezoelectric element generates voltage in accordance with applied pressure and deforms in accordance with applied voltage.

Figure 2A:
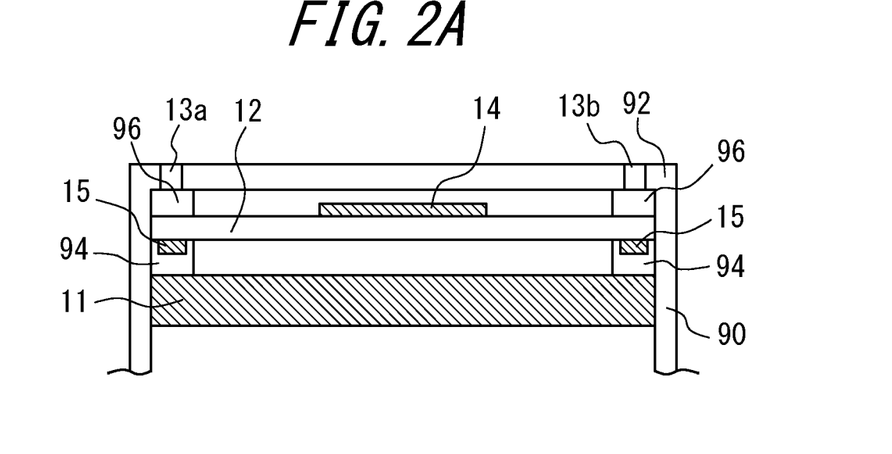
FIG. 2A is a main cross-section of an example configuration of the tactile sensation providing apparatus according to the first embodiment.
Figure 2B:
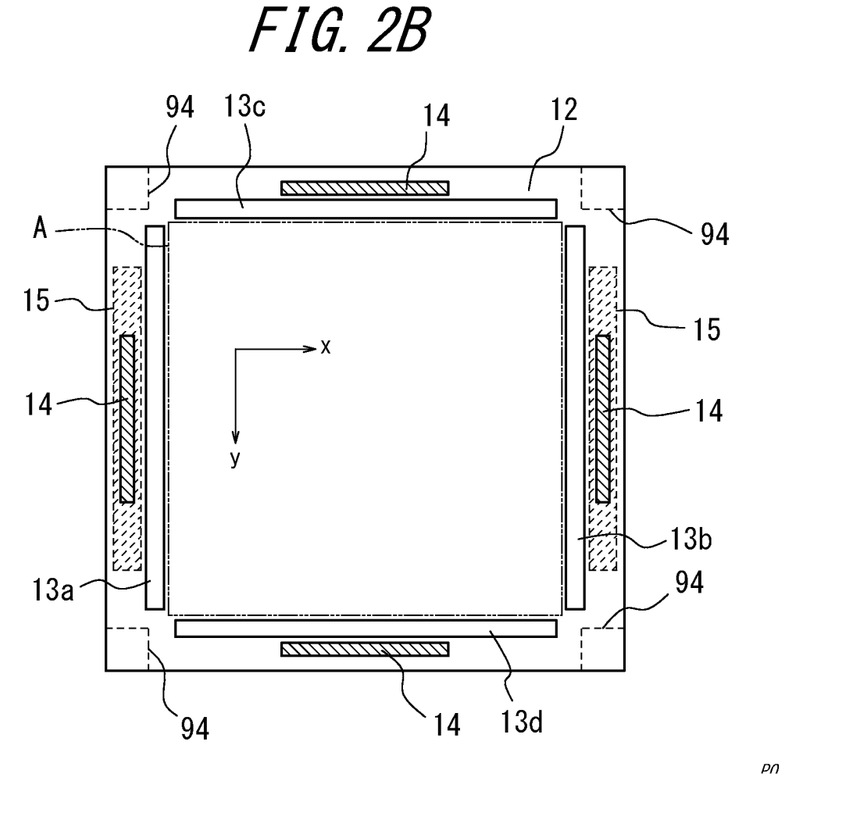
FIG. 2B is a main plan view of an example configuration of the tactile sensation providing apparatus according to the first embodiment.

As illustrated in FIG. 2A, the display 11 that displays various content is held and stored within a housing 90. The touch sensor 12 is held above the display 11 via first insulators 94 made from elastic members. The touch sensor 12 included in the tactile sensation providing apparatus 1 according to the present embodiment is rectangular, as illustrated in FIG. 2B. The touch sensor 12 is illustrated as being square in FIG. 2B but may have a different shape, such as an oblong shape, in accordance with the specifications of the tactile sensation providing apparatus 1 in which the touch sensor 12 is mounted. The first insulators 94 are disposed at the four corners away from the display area A of the display 11, as indicated by the imaginary lines in FIG. 2B.

As illustrated in FIG. 2A, an upper cover 92 is provided in the housing 90 to cover the surface area of the touch sensor 12 away from the display area A of the display 11. Second insulators 96 made from elastic members are disposed between the upper cover 92 and the touch sensor 12. Like the first insulators 94, the second insulators 96 are disposed at the four corners away from the display area A of the display 11, as indicated by the imaginary lines in FIG. 2B. The housing 90, the upper cover 92, and the second insulators 96 illustrated in FIG. 2A are omitted from FIG. 2B.

As illustrated in FIG. 2A and FIG. 2B, light-blocking proximity sensors 13a, 13b, 13c, and 13d are provided on the inside of the upper cover 92. The proximity sensors 13a, 13b, 13c, and 13d are collectively referred to as the proximity sensor 13. As illustrated in FIG. 2B, the proximity sensor 13 is disposed on the outer side of the four sides of the display area A of the display 11.

The two proximity sensors 13a and 13b and the two proximity sensors 13c and 13d disposed on opposing sides function in pairs. In this case, one proximity sensor in each pair of proximity sensors 13 functions as a projector, such as the proximity sensors 13a and 13c, while the other functions as an optical detector, such as the proximity sensors 13b and 13d. The proximity sensors 13a and 13c functioning as projectors include a plurality of light-emitting elements arranged in a line. The proximity sensors 13b and 13d functioning as optical detectors include a plurality of light-detecting elements arranged in a line. The light-emitting elements of the proximity sensor 13a and the light-detecting elements of the proximity sensor 13b are arranged to correspond so that the light projected by one is detected by the other. The light-emitting elements of the proximity sensor 13c and the light-detecting elements of the proximity sensor 13d are arranged similarly.

As described above, the light-blocking proximity sensor 13 is configured so that light emitted from the projectors to enter the optical detectors passes through a plane that is a predetermined distance from the touch surface of the touch sensor 12. As illustrated in FIG. 2A, when the proximity sensor 13 is provided in the upper cover 92, the above-described predetermined distance can be adjusted by the thickness of the second insulators 96 provided between the touch surface of the touch sensor 12 and the upper cover 92. The above-described predetermined distance can also be adjusted by the positional relationship between the proximity sensor 13 and the upper cover 92.

As illustrated in FIG. 2B, when xy-coordinates on the touch surface of the touch sensor 12 are used, the light-emitting elements of the proximity sensor 13a and the light-detecting elements of the proximity sensor 13b are arranged in a line in the y-axis direction. The proximity sensor 13 detects the approach of a finger when light blocking is detected due to one of the light-detecting elements of the proximity sensor 13b no longer detecting light. Along with detecting the approach of a finger, the proximity sensor 13 can detect the y-coordinate of the approach position of the finger by identifying the light-detecting element for which the light blocking was detected.

Similarly, the light-emitting elements of the proximity sensor 13c and the light-detecting elements of the proximity sensor 13d are arranged in a line in the x-axis direction. The proximity sensor 13 detects the approach of a finger when light blocking is detected due to one of the light-detecting elements of the proximity sensor 13d no longer detecting light. Along with detecting the approach of a finger, the proximity sensor 13 can detect the x-coordinate of the approach position of the finger by identifying the light-detecting element for which the light blocking was detected.

As described above, the touch sensor 12 can function also as the proximity sensor 13. In this case, the proximity sensor 13 illustrated in FIG. 2A and FIG. 2B need not be provided.

The touch sensor 12 is, for example, configured so that the front surface, which becomes the operation surface operated by being touched by the user's finger, is a transparent film and the back surface on the opposite side from the operation surface is glass. The touch sensor 12 may be structured so that the transparent film on the front surface is slightly deflected or warped in accordance with pressure when the front surface, which is the operation surface, is pressed.

The tactile sensation providing apparatus 1 according to the present embodiment may include a strain gauge sensor, for detecting pressure on the touch sensor 12, on the transparent film at the front surface of the touch sensor 12 near each side covered by the upper cover 92. The strain gauge sensors may, for example, be adhered to the transparent film. The tactile sensation providing apparatus 1 may include piezoelectric elements, ultrasonic transducers, linear actuators, or the like for vibrating the touch sensor 12 on the glass at the back surface of the touch sensor 12 near two opposing sides. The piezoelectric elements, ultrasonic transducers, linear actuators, or the like may, for example, be adhered to the glass. The tactile sensation providing apparatus 1 in FIG. 2A and FIG. 2B includes four strain gauge sensors as the pressure detector 14 and includes two transducers as the tactile sensation provider 15. The pressure detector 14 may detect the pressure from, for example, the average of output from the four strain gauge sensors. The tactile sensation provider 15 may, for example, drive the two transducers in phase.

[Tactile Sensation Providing Process]

The tactile sensation providing apparatus 1 according to the present embodiment can provide a click feeling when a finger pushes down on or releases the touch surface of the touch sensor 12. The tactile sensation providing apparatus 1 can provide a material feeling, such as a rough feeling or a smooth feeling, when a finger slides on the touch surface of the touch sensor 12. The tactile sensation providing apparatus 1 can provide an uneven feeling or other tactile sensation. The tactile sensation providing apparatus 1 can provide a variety of tactile sensations in overlap, such as providing a click feeling while providing a material feeling.

A smooth feeling, for example, can be provided by the tactile sensation provider 15 generating high-frequency vibration to generate a film of air between the touch surface of the touch sensor 12 and the touching finger, so that the film of air reduces the frictional force. A rough feeling, for example, can be provided by the tactile sensation provider 15 changing the vibration to vary the magnitude of the frictional force in conjunction with sliding of the finger. The methods for providing these tactile sensations are not limited to the examples described here.

The touch surface of the touch sensor 12 in the tactile sensation providing apparatus 1 according to the present embodiment may be configured by a uniform material, such as glass or a film, like a typical touch sensor 12. When the touch surface is configured by a uniform material, a user who touches the touch sensor 12 without looking does not know which portion of the touch sensor 12 was touched and cannot perceive the touch position.

A user who is not looking at the touch sensor 12 can perceive the touch position through the presentation of a tactile sensation in accordance with the touch position on the touch surface of the touch sensor 12 or through the presentation of a tactile sensation in accordance with sliding of the touching finger.

Figure 3:
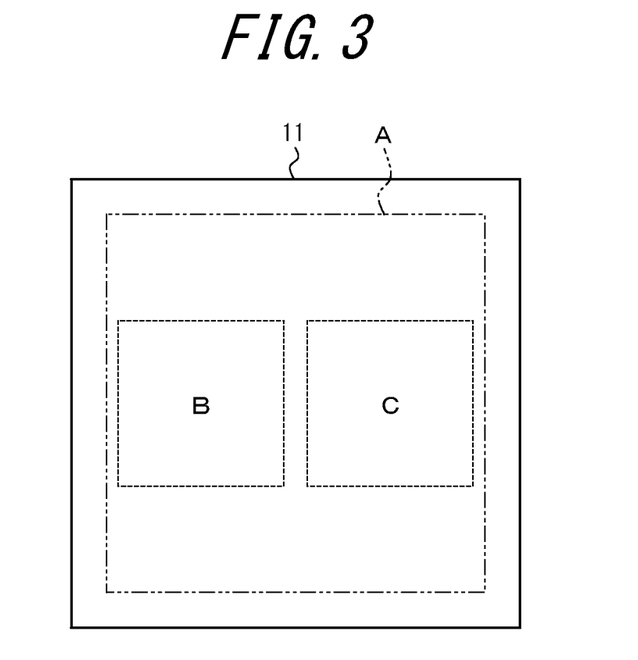
FIG. 3 is an example of what is displayed on a display.

As illustrated in FIG. 3, two areas are provided within the display area A: an area B and an area C. These areas are assumed to correspond to operation objects.

For example, the tactile sensation providing apparatus 1 can provide a tactile sensation for the user to perceive a rough feeling when the finger touches and slides in area B or area C. This approach allows the user to perceive that an operation object is located at the touched location. On the other hand, the tactile sensation providing apparatus 1 can be configured not to provide a tactile sensation when a finger touches and slides in a location other than area B and area C within the display area A. This configuration allows the user to perceive that no operation object is located at the touched location.

For example, when a finger touches a location within the display area A other than area B and area C and then slides towards the inside of area B or area C, the tactile sensation providing apparatus 1 may provide an uneven tactile sensation at the border of area B or area C.

The arrangement of the operation objects displayed on the display 11 is not limited to the example in FIG. 3. The operation objects may be fixed or rearranged dynamically. When arrangement of the operation objects is fixed, the user can memorize the arrangement and relay on memory to perform operations by touch without looking. When operation objects are rearranged dynamically, the user cannot memorize the arrangement of the operation objects. In this case, the user can perform operations by touch without looking by being able to perceive the arrangement of operation objects through a tactile sensation upon touching the touch surface.

When the tactile sensation providing apparatus 1 does not include the display 11, the operation objects may be arranged virtually on the touch sensor 12. In this case, the user cannot perceive the arrangement of the operation objects visually. In this case as well, the user can perceive the arrangement of operation objects with the sense of touch by being able to perceive the arrangement of operation objects through provision of a tactile sensation. With this approach, the user can operate the operation objects arranged virtually on the touch sensor 12.

As described above, the tactile sensation providing apparatus 1 according to the present embodiment can provide the user a tactile sensation by vibrating the touch surface of the touch sensor 12. When a material feeling is provided as the tactile sensation, the material feeling that the user perceives differs depending on the timing at which vibration in the vibration pattern corresponding to the material feeling is generated. Specifically, the material feeling that the user perceives differs depending on whether vibration starts before or after the user touches the touch sensor 12. In the tactile sensation providing method according to the present embodiment, vibration starts before touching. In the comparative example described below, vibration starts after touching for the sake of comparison with the tactile sensation providing method according to the present embodiment.

Comparative Example: Start of Vibration After Touching

In this case, no vibration is being generated in the touch sensor 12 at the point when the user touches the touch sensor 12. The user perceives a tactile sensation of the actual material constituting the touch surface of the touch sensor 12 from the time of the touch until vibration starts.

When the controller 10 acquires a signal indicating detection of a touch from the touch sensor 12, the controller 10 starts to drive the tactile sensation provider 15 to provide a tactile sensation corresponding to the location where the touch was detected and causes the tactile sensation provider 15 to generate vibration in a corresponding vibration pattern. This processing takes a finite amount of time. Hence, a time lag occurs between when the user touches the touch sensor 12 and the start of vibration.

When a time lag thus occurs before the start of vibration, the user perceives an unnatural change between the initial tactile sensation of the actual material of the touch surface and the subsequently added tactile sensation due to vibration.

Present Embodiment: Start of Vibration Before Touching

In this case, the controller 10 starts to drive the tactile sensation provider 15 to start vibration before the user touches the touch sensor 12. With this approach, no time lag occurs between when the user touches the touch sensor 12 and the start of vibration. Because no time lag occurs, the user does not perceive the tactile sensation as being unnatural, as in the comparative example. The tactile sensation providing method according to the present embodiment, described below in detail, is a method for starting preliminary driving of the tactile sensation provider 15 before a touch.

Figure 4:
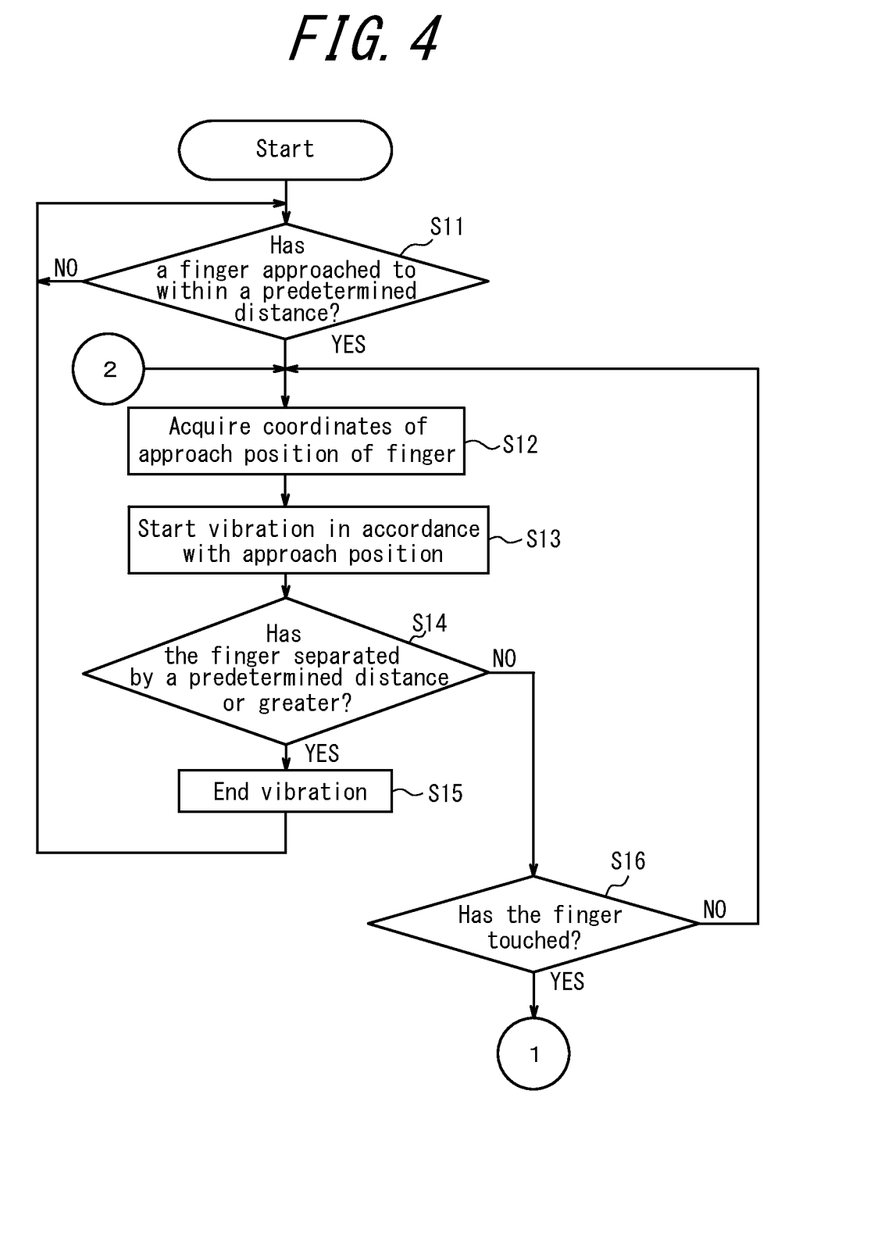
FIG. 4 is a flowchart illustrating an example of a tactile sensation providing method according to the first embodiment.
Figure 5:
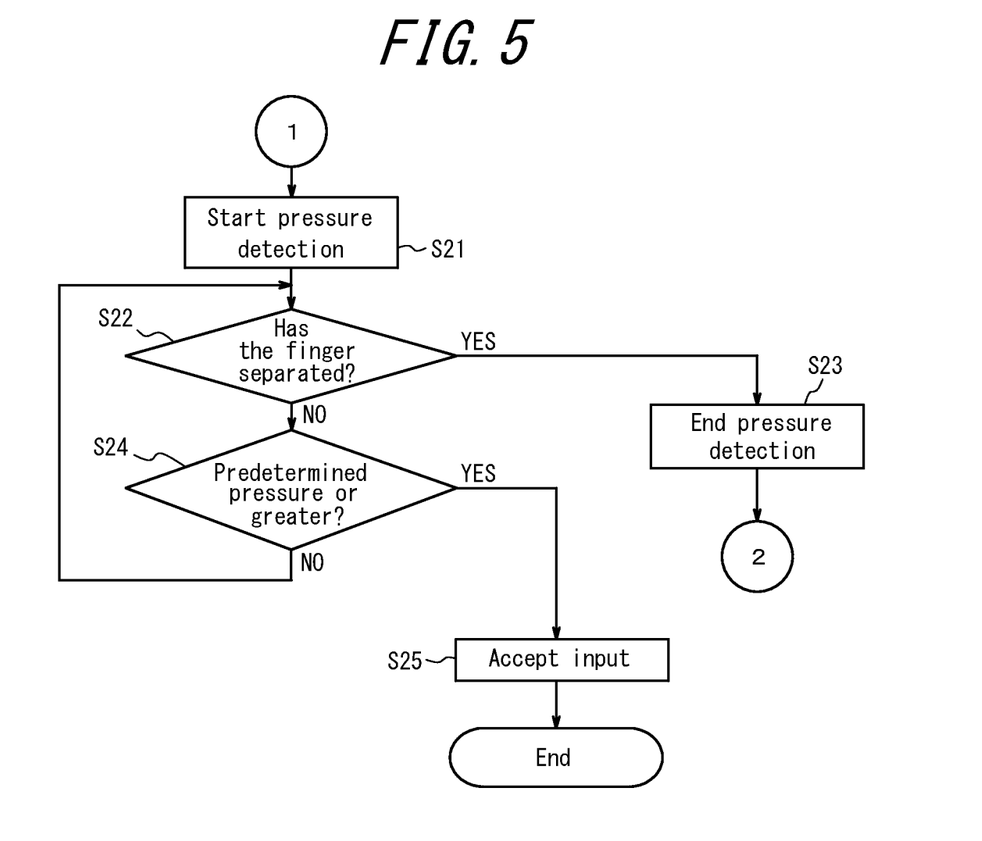
FIG. 5 is a flowchart illustrating an example of the tactile sensation providing method according to the first embodiment.

FIG. 4 illustrates operations until a finger touches the touch sensor 12. FIG. 5 illustrates operations after a finger touches the touch sensor 12.

The controller 10 of the tactile sensation providing apparatus 1 acquires control information from the proximity sensor 13 indicating whether a finger has approached to within a predetermined distance from the touch surface of the touch sensor 12 and judges whether the finger has approached to within a predetermined distance from the touch surface (FIG. 4, step S11).

When a finger has not approached to within a predetermined distance from the touch surface (step S11: NO), the controller 10 returns to step S11 and continues to judge whether a finger has approached to within a predetermined distance from the touch surface.

When a finger has approached to within a predetermined distance from the touch surface (step S11: YES), the controller 10 acquires the coordinates of the approach position of the finger from the proximity sensor 13 (step S12). The coordinates of the approach position of the finger are also referred to as the approach position. When the touch sensor 12 functions also as the proximity sensor 13, the controller 10 acquires the approach position from the touch sensor 12.

The controller 10 automatically starts to drive the tactile sensation provider 15 by outputting a drive signal to the tactile sensation provider 15 in response to detection of approach by the proximity sensor 13 (step S13). The controller 10 causes the tactile sensation provider 15 to generate vibration in accordance with the approach position. For example, when the approach position is in area B or area C illustrated in FIG. 3, vibration for providing a predetermined tactile sensation begins. For example, the predetermined tactile sensation may be a rough feeling, but the tactile sensation is not limited to this example and may be any tactile sensation allowing perception that the finger has touched area B or area C. The predetermined tactile sensation may differ between area B and area C. For example, a first tactile sensation may be provided in area B. A second tactile sensation different from the first tactile sensation may be provided in area C. This approach may be adopted so that the user can distinguish between having touched area B and area C by sense of touch.

When the approach position is a location other than area B or area C in FIG. 3, the controller 10 may cause the tactile sensation provider 15 not to start vibration. Alternatively, the controller 10 may cause the tactile sensation provider 15 to start vibration for providing a smooth feeling as the predetermined tactile sensation.

The controller 10 acquires a signal from the proximity sensor 13 and judges whether the finger has separated from the touch surface of the touch sensor 12 by a predetermined distance or greater (step S14).

When the finger has separated from the touch surface by a predetermined distance or greater (step S14: YES), the controller 10 causes the tactile sensation provider 15 to end vibration (step S15). The controller 10 returns to step S11 and again judges whether a finger has approached to within a predetermined distance from the touch surface.

When the finger has not separated from the touch surface by a predetermined distance or greater (step S14: NO), the controller 10 judges whether the finger has touched the touch surface (step S16).

When the finger is not touching the touch surface (step S16: NO), the controller 10 returns to step S12 and again acquires the approach position.

When the finger is touching the touch surface (step S16: YES), the controller 10 proceeds to step S21 in FIG. 5.

Operations up to when the finger touches the touch surface of the touch sensor 12 have been described with reference to FIG. 4. By these operations, the controller 10 has already started to drive the tactile sensation provider 15, and the touch sensor 12 has started to vibrate for providing a predetermined tactile sensation, at the point when the finger touches the touch surface of the touch sensor 12. Consequently, the finger touching the touch surface feels the predetermined tactile sensation naturally, rather than feeling the tactile sensation of the actual material of the touch surface.

In the flowchart in FIG. 4, the controller 10 acquires the approach position in step S12 and causes the tactile sensation provider 15 to start vibrating in accordance with the approach position in step S13. The controller 10 is not limited to these operations and may be configured not to execute step S12. In this case, the controller 10 may cause the tactile sensation provider 15 to start predetermined vibration in step S13 regardless of the approach position.

As illustrated in FIG. 5, the controller 10 starts the flow of pressure detection to obtain the pressure of a finger on the touch surface (step S21).

The controller 10 judges whether the finger has separated from the touch surface (step S22).

When the finger has separated from the touch surface (step S22: YES), the controller 10 ends the flow of pressure detection (step S23) and returns to step S12 in FIG. 4.

When the finger has not separated from the touch surface (step S22: NO), the controller 10 judges whether the detected pressure is a predetermined pressure or greater (step S24). When the detected pressure is not the predetermined pressure or greater (step S24: NO), the controller 10 returns to step S22.

When the detected pressure is the predetermined pressure or greater (step S24: YES), the controller 10 accepts input at the location touched by the finger (step S25) and ends the processing.

Operations from when the finger touches the touch surface of the touch sensor 12 until input is accepted have been described with reference to FIG. 5. By these operations, a user can judge whether he is touching the position where he intends to perform an operation without looking at the touch surface of the touch sensor 12. Since input is not accepted by the user's finger merely touching the touch surface, the user can search for the position where he intends to perform an operation while confirming the tactile sensation obtained from the touch surface. When the user confirms that he is touching the position where he intends to perform an operation, the user can push down on the touch surface for input to be accepted. This configuration allows the user to perform operations by touch without looking on the basis of a natural tactile sensation obtained by touching the touch surface.

The tactile sensation providing apparatus 1 according to the present embodiment can start vibration for providing a predetermined tactile sensation before a finger touches the touch surface. Consequently, the user can obtain a natural tactile sensation when her finger touches the touch surface.

The tactile sensation providing apparatus 1 according to the present embodiment starts driving of the tactile sensation provider 15 to vibrate the touch sensor 12 after a finger approaches the touch surface. This configuration can reduce the operating time of the tactile sensation provider 15 as compared to a configuration that always vibrates the touch sensor 12 as a preliminary measure. Consequently, the power consumption can be reduced. This makes the tactile sensation provider 15 less prone to deterioration.

The configuration to detect the approach position and to start vibration in accordance with the approach position allows provision of different tactile sensations in accordance with the position touched by a finger. Consequently, the user can perceive the position on the touch surface that the finger is touching.

A configuration such that input is not accepted after a finger touches the touch surface unless the finger pushes down on the touch surface allows the user to perform operations by touch without looking on the basis of a natural tactile sensation obtained by touching the touch surface.

Second Embodiment

Figure 6:
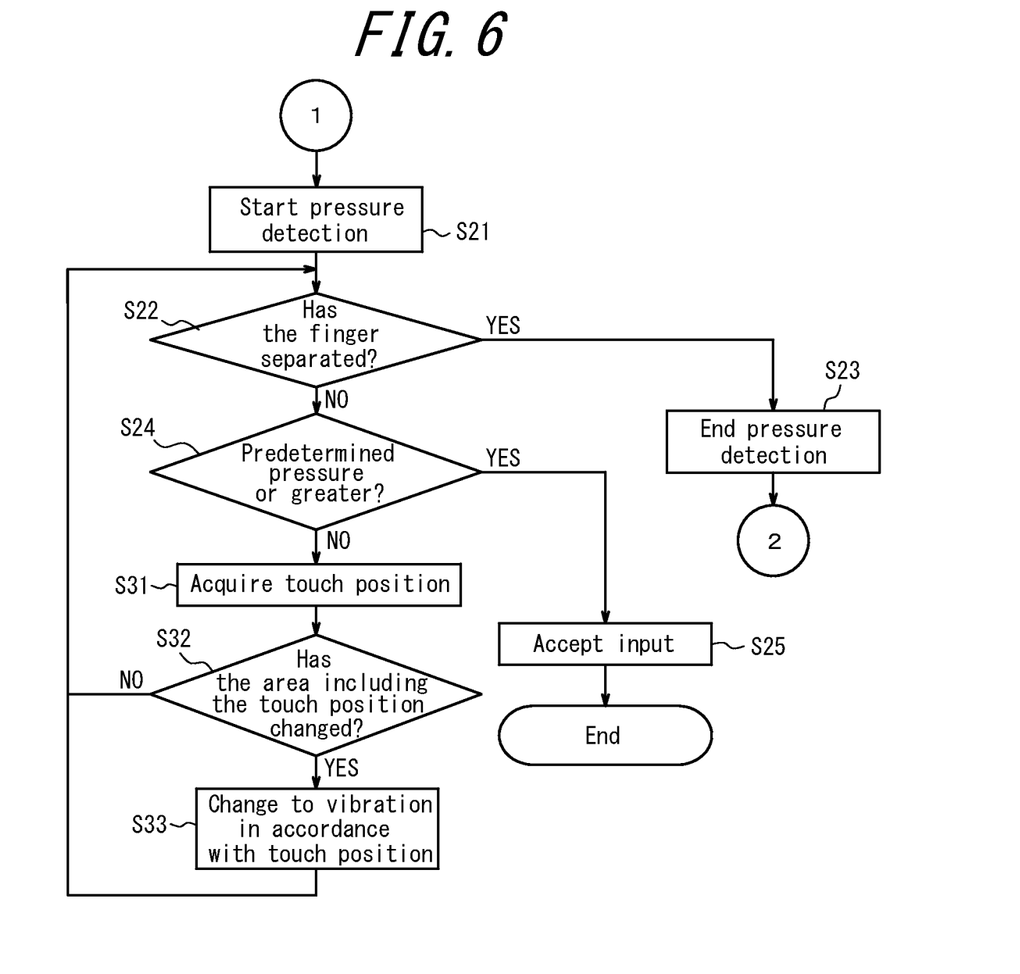
FIG. 6 is a flowchart of a tactile sensation providing method according to a second embodiment.

As illustrated in FIG. 6, the tactile sensation providing method according to the second embodiment can provide a tactile sensation in accordance with movement to a finger that, while touching the touch surface, moves so that the coordinates being touched change. The tactile sensation providing method illustrated in FIG. 6 differs from FIG. 5 in that processing proceeds from step S24 to step S31 when the pressure detected by the controller 10 is not the predetermined pressure or greater in step S24 (step S24: NO). Steps S21 to S23 are the same as FIG. 5.

In FIG. 6, when the pressure detected by the controller 10 is not the predetermined pressure or greater (step S24: NO), the controller 10 acquires the coordinates being touched by the finger on the touch surface from the touch sensor 12 (step S31). The coordinates being touched by the finger on the touch surface are also referred to as the touch position.

The controller 10 judges whether the area that includes the touch position has changed (step S32). The controller 10 judges that the area that includes the touch position has changed when the area that includes the current touch position differs from the area that previously included the touch position.

When the area that includes the touch position has not changed (step S32: NO), the controller 10 returns to step S22.

When the area that includes the touch position has changed (step S32: YES), the controller 10 causes the tactile sensation provider 15 to change to vibration in accordance with the area that changed (step S33). The controller 10 then returns to step S22.

The tactile sensation providing apparatus 1 according to the second embodiment allows the user to search for the position for desired input to be accepted while touching the touch surface. This configuration can improve operability.

Although embodiments of the present disclosure have been described with reference to the drawings and examples, it is to be noted that various changes and modifications will be apparent to those skilled in the art based on the present disclosure. Therefore, such changes and modifications are to be understood as included within the scope of this disclosure. For example, the functions and the like included in the various components and steps may be reordered in any logically consistent way. Furthermore, components or steps may be combined into one or divided. While embodiments of the present disclosure have been described focusing on apparatuses, the present disclosure may also be embodied as a method that includes steps performed by the components of an apparatus. Furthermore, while embodiments of the present disclosure have been described focusing on apparatuses, embodiments of the present disclosure may also be implemented as a method or program executed by a processor provided in an apparatus, or as a recording medium on which a program is recorded. Such embodiments are also to be understood as included in the scope of the present disclosure. It is to be noted that the proximity sensor 13 is not limited to the examples described in the embodiments of the present disclosure. The pressure detector 14 is also not limited to the examples described in the embodiments of the present disclosure.

REFERENCE SIGNS LIST

1 Tactile sensation providing apparatus
10 Controller
11 Display
12 Touch sensor
13 (13a, 13b, 13c, 13d) Proximity sensor
14 Press detector
15 Tactile sensation provider
16 Memory
90 Housing
92 Upper cover
94 First insulator
96 Second insulator

The invention claimed is:

1. A tactile sensation providing apparatus comprising:
a touch sensor configured as an in-vehicle device;
a tactile sensation generator configured to generate a tactile sensation on a touch surface of the touch sensor;
a proximity sensor configured to detect an approach of an object to the touch sensor;
a controller configured to start driving of the tactile sensation generator to generate the tactile sensation by outputting a drive signal to the tactile sensation generator in response to detection of the approach by the proximity sensor; and
an insulator that contacts the touch sensor and defines an opening in which the tactile sensation generator is disposed,
wherein, in plan view, the proximity sensor is positioned further toward a center of the touch sensor than the tactile sensation generator, and
wherein when the object touches the touch surface and a pressure detected by the controller is not a predetermined pressure or greater, the controller is further configured to acquire coordinates being touched by the object on the touch surface of the touch sensor and when an area that includes the coordinates has changed, cause the tactile sensation generator to change to vibration in accordance with the area.

2. The tactile sensation providing apparatus according to claim 1, further comprising:
an upper cover; and
wherein the proximity sensor is configured as first and second proximity sensors which are disposed in the upper cover and above the touch sensor, the first proximity sensor is provided along an edge of the upper cover closest to the first area of the touch sensor, and the second proximity sensor is provided along an edge of the upper cover closest to the second area of the touch sensor.

3. The tactile sensation providing apparatus according to claim 2, further comprising:
insulators disposed below the first and second proximity sensors between the upper cover and the touch sensor.

4. A tactile sensation providing method comprising:
detecting, using a proximity sensor, an approach of an object to a touch sensor configured as an in-vehicle device;
starting driving of a tactile sensation generator to generate a tactile sensation on a touch surface of the touch sensor by outputting a drive signal to the tactile sensation generator in response to detection of the approach by the proximity sensor; and
when the object touches the touch surface and a pressure detected by the controller is not a predetermined pressure or greater, acquiring coordinates being touched by the object on the touch surface of the touch sensor and when an area that includes the coordinates has changed, causing the tactile sensation generator to change to vibration in accordance with the area, wherein an insulator contacts the touch sensor and defines an opening in which the tactile sensation generator is disposed, and wherein, in plan view, the proximity sensor is positioned further toward a center of the touch sensor than the tactile sensation generator.

5. The method according to claim 4, wherein
the proximity sensor is configured as first and second proximity sensors which are disposed in an upper cover and above the touch sensor, the first proximity sensor is provided along an edge of the upper cover closest to the first area of the touch sensor, and the second proximity sensor is provided along an edge of the upper cover closest to the second area of the touch sensor.

6. The method according to claim 5, wherein:
insulators are disposed below the first and second proximity sensors between the upper cover and the touch sensor.

7. A tactile sensation providing apparatus comprising:
a touch sensor;
a tactile sensation generator configured to generate a tactile sensation on a touch surface of the touch sensor, the touch surface including a first area and a second area;
a proximity sensor configured to detect an approach of an object to the touch sensor;
a controller configured to start driving of the tactile sensation generator to generate the tactile sensation by outputting a drive signal to the tactile sensation generator in response to detection of the approach by the proximity sensor, such that the controller drives the tactile sensation generator to generate the tactile sensation having a first type of sensation when the proximity sensor detects an approach of the object to the first area of the touch sensor, a second type of sensation when the proximity sensor detects an approach of the object to the second area of the touch sensor, and a third type of sensation when the proximity sensor detects sliding of the object from an area of the touch sensor outside of the first area and the second area into the first area or the second area; and
an insulator that contacts the touch sensor and defines an opening in which the tactile sensation generator is disposed,
wherein, in plan view, the proximity sensor is positioned further toward a center of the touch sensor than the tactile sensation generator, and
wherein when the object touches the touch surface and a pressure detected by the controller is not a predetermined pressure or greater, the controller is further configured to acquire coordinates being touched by the object on the touch surface of the touch sensor and when an area that includes the coordinates has changed, cause the tactile sensation generator to change to vibration in accordance with the area.

8. The tactile sensation providing apparatus according to claim 7, wherein
the touch sensor is configured as an in-vehicle device.

9. The tactile sensation providing apparatus according to claim 7, further comprising:
an upper cover; and
wherein the proximity sensor is configured as first and second proximity sensors which are disposed in the upper cover and above the touch sensor, the first proximity sensor is provided along an edge of the upper cover closest to the first area of the touch sensor, and the second proximity sensor is provided along an edge of the upper cover closest to the second area of the touch sensor.

10. The tactile sensation providing apparatus according to claim 9, further comprising:
insulators disposed below the first and second proximity sensors between the upper cover and the touch sensor.

11. A tactile sensation providing method comprising:
detecting, using a proximity sensor, an approach of an object to a touch sensor including a first area and a second area; and
starting driving of a tactile sensation generator to generate a tactile sensation on a touch surface of the touch sensor by outputting a drive signal to the tactile sensation generator in response to detection of the approach by the proximity sensor, such that the tactile sensation generator is driven to generate the tactile sensation having a first type of sensation when the proximity sensor detects an approach of the object to the first area of the touch sensor, a second type of sensation when the proximity sensor detects an approach of the object to the second area of the touch sensor, and a third type of sensation when the proximity sensor detects sliding of the object from an area of the touch sensor outside of the first area and the second area into the first area or the second area; and
when the object touches the touch surface and a pressure detected by the controller is not a predetermined pressure or greater, acquiring coordinates being touched by the object on the touch surface of the touch sensor and when an area that includes the coordinates has changed, causing the tactile sensation generator to change to vibration in accordance with the area,
wherein an insulator contacts the touch sensor and defines an opening in which the tactile sensation generator is disposed, and
wherein, in plan view, the proximity sensor is positioned further toward a center of the touch sensor than the tactile sensation generator.

12. The method according to claim 11, wherein
the touch sensor is configured as an in-vehicle device.

13. The method according to claim 11, wherein
the proximity sensor is configured as first and second proximity sensors which are disposed in an upper cover and above the touch sensor, the first proximity sensor is provided along an edge of the upper cover closest to the first area of the touch sensor, and the second proximity sensor is provided along an edge of the upper cover closest to the second area of the touch sensor.

14. The method according to claim 13, wherein:
insulators are disposed below the first and second proximity sensors between the upper cover and the touch sensor.

* * * * *